United States Patent
Park et al.

(10) Patent No.: US 9,048,808 B2
(45) Date of Patent: Jun. 2, 2015

(54) SEALED CRYSTAL OSCILLATOR AND SEMICONDUCTOR PACKAGE INCLUDING THE SAME

(71) Applicants: Jae-Jin Park, Seongnam-si (KR); Hee-Seok Lee, Yongin-si (KR); Ji-Hwan Hyun, Daegu (KR); Kang-Yeop Choo, Suwon-si (KR)

(72) Inventors: Jae-Jin Park, Seongnam-si (KR); Hee-Seok Lee, Yongin-si (KR); Ji-Hwan Hyun, Daegu (KR); Kang-Yeop Choo, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 76 days.

(21) Appl. No.: 13/803,308

(22) Filed: Mar. 14, 2013

(65) Prior Publication Data
US 2014/0232477 A1    Aug. 21, 2014

(30) Foreign Application Priority Data
Feb. 21, 2013    (KR) .................. 10-2013-0018869

(51) Int. Cl.
    H03H 9/10    (2006.01)
    H03H 9/05    (2006.01)

(52) U.S. Cl.
    CPC ........... *H03H 9/0542* (2013.01); *H03H 9/0547* (2013.01); *H03H 9/1014* (2013.01)

(58) Field of Classification Search
    USPC ....................................... 331/68, 158
    See application file for complete search history.

(56) References Cited

U.S. PATENT DOCUMENTS 7,522,006 B2 *    4/2009    Mizumura et al. ............ 331/158

FOREIGN PATENT DOCUMENTS

| JP | 2006041931 | 2/2006 |
|----|------------|--------|
| JP | 2007180701 | 7/2007 |
| JP | 2007201044 | 8/2007 |
| JP | 2007201616 | 8/2007 |
| JP | 2008312265 | 12/2008 |
| JP | 2011009973 | 1/2011 |
| KR | 10-2007-0066928 | 6/2007 |

* cited by examiner

*Primary Examiner* — Joseph Chang
(74) *Attorney, Agent, or Firm* — Onello & Mello, LLP

(57) ABSTRACT

A semiconductor package includes a package substrate; an integrated circuit chip formed on one surface of the package substrate; and a sealed quartz oscillator formed on at least one of an inside, one surface, and the other surface of the package substrate, wherein the sealed quartz oscillator includes a substrate, a quartz blank formed on one surface of the substrate, and a sealing cap covering at least one surface of the quartz blank and including metal.

10 Claims, 11 Drawing Sheets

SEALED CRYSTAL OSCILLATOR AND SEMICONDUCTOR PACKAGE INCLUDING THE SAME

CROSS-REFERENCE TO RELATED APPLICATIONS

This U.S. non-provisional application is claims priority under 35 U.S.C. §119 to Korean Patent Application No. 10-2013-0018869, filed on Feb. 21, 2013, in the Korean Intellectual Property Office, the contents of which are herein incorporated by reference in their entirety.

BACKGROUND

1. Field of the Invention

The present inventive concepts relate to a sealed crystal oscillator and a semiconductor package including the same.

2. Description of the Prior Art

Crystal oscillators are used in various fields, such as computers, communication devices, artificial satellites in space, and measuring instruments. However, the crystal oscillators are affected by changes of surrounding temperature/humidity or fine foreign substances. Therefore, the characteristics of the crystal oscillators may be delicately changed. Further, the crystal oscillators may be easily damaged by mechanical vibrations or impact.

SUMMARY

One feature of the present inventive concepts is to provide semiconductor package including a sealed crystal oscillator having stable operating characteristics.

Another feature of the present inventive concepts is to provide a sealed crystal oscillator having stable operating characteristics.

Additional advantages and features of the inventive concepts will be set forth in part in the description which follows and in part will become apparent to those having ordinary skill in the art upon examination of the following or may be learned from practice of the inventive concepts.

According to an aspect of the present inventive concepts, there is provided a semiconductor package comprising: a package substrate; an integrated circuit chip disposed on one surface of the package substrate; and a sealed quartz oscillator disposed on at least one of an interior portion, a first surface of an exterior portion, and a second surface of an exterior portion opposite the first surface of the exterior portion of the package substrate, wherein the sealed quartz oscillator includes a substrate, a quartz blank formed on one surface of the substrate, and a sealing cap covering at least one surface of the quartz blank and including metal.

In some embodiments, the sealing cap covers an upper surface or a side surface of the quartz blank.

In some embodiments, the substrate is in a line-shape, and the sealing cap is formed on the substrate in a box-shape to cover the quartz blank.

In some embodiments, the substrate is in a L-shape, and the sealing cap is formed on the substrate in an L-shape opposite to the L-shape of the substrate to cover the quartz blank.

In some embodiments, the substrate is in a U-shape, and the sealing cap is formed on the substrate in a line-shape to cover the quartz blank.

In some embodiments, the sealed quartz oscillator is formed on a side surface, an upper surface, or a lower surface of the integrated circuit chip.

In some embodiments, the sealed quartz oscillator further comprises a plurality of electrode patterns electrically connected to the quartz blank disposed on the substrate, and a plurality of through-electrodes electrically connected to the plurality of electrode patterns disposed through the substrate, respectively.

In some embodiments, at least one of the plurality of through-electrodes is positioned on a side surface or an upper surface of the quartz blank.

In some embodiments, the substrate and the sealing cap are bonded together by a bonding portion that is formed through melting of a metal material.

In some embodiments, the metal material is AuSn.

In some embodiments, the semiconductor package is in a POP (Package On Package) shape.

In some embodiments, the integrated circuit chip comprises a plurality of stacked integrated circuit chips.

According to another aspect of the present inventive concepts, there is provided a sealed semiconductor package having a built-in sealed quartz oscillator, wherein the sealed quartz oscillator comprises: a first substrate; a second substrate disposed on a part of the first substrate; a quartz blank disposed in a space that is formed by the first substrate and the second substrate; a sealing cap disposed on the second substrate, covering one surface of the quartz blank, and including metal; and a bonding portion formed by melting of a metal material to bond the second substrate and the sealing cap together.

In some embodiments, the bonding portion is made of AuSn.

In some embodiments, the sealing cap is in a line-shape.

In some embodiments, the first substrate comprises a plurality of electrode patterns electrically connected to the quartz blank disposed thereon, and a plurality of through-electrodes electrically connected to the plurality of electrode patterns, respectively.

According to another aspect of the present inventive concepts, there is provided a semiconductor package having a built-in sealed quartz oscillator, wherein the sealed quartz oscillator comprises: a quartz blank; a substrate including a plurality of through-electrodes which are electrically connected to the quartz blank; and a sealing cap covering at least one surface of the quartz blank and including metal, wherein at least one of the plurality of through-electrodes is positioned adjacent to a side surface or an upper surface of the quartz blank.

In some embodiments, the substrate comprises a first portion, and a second portion connected to the first portion and formed perpendicular to the first portion, and at least one of the plurality of through-electrodes is formed on the second portion.

In some embodiments, the substrate further comprises a third portion connected to the second portion and formed in parallel to the first portion, and at least one of the plurality of through-electrodes is formed on the third portion.

In some embodiments, the substrate comprises a lower substrate positioned adjacent to a lower portion of the quartz blank, and an upper substrate positioned adjacent to an upper portion of the quartz blank, and at least one of the plurality of through-electrodes is positioned on the lower substrate, and at least one of the plurality of through-electrodes is positioned on the upper substrate.

According to another aspect of the present inventive concepts, there is provided a sealed quartz oscillator built in a semiconductor package, comprising: a substrate; a quartz blank disposed on one surface of the substrate; and a sealing cap covering at least one surface of the quartz blank and including metal.

In some embodiments, the sealing cap covers an upper surface or a side surface of the quartz blank.

In some embodiments, the substrate is in a line-shape, and the sealing cap is formed on the substrate in a box-shape to cover the quartz blank.

In some embodiments, the substrate is in a L-shape, and the sealing cap is formed on the substrate in a L-shape opposite to the L-shape of the substrate to cover the quartz blank.

In some embodiments, the substrate is in a U-shape, and the sealing cap is formed on the substrate in a line-shape to cover the quartz blank.

According to another aspect of the present inventive concepts, there is provided a semiconductor package having a sealed quartz oscillator, wherein the sealed quartz oscillator comprises a substrate; a quartz blank disposed on one surface of the substrate; and a sealing cap covering at least one surface of the quartz blank and comprising metal.

In some embodiments, the sealing cap covers an upper surface or a side surface of the quartz blank.

In some embodiments, the semiconductor package further comprises a package substrate and an integrated circuit chip disposed on one surface of the package substrate. The sealed quartz oscillator is disposed on at least one of an interior portion and an exterior portion of the package substrate.

In some embodiments, the sealed quartz oscillator further comprises a plurality of electrode patterns electrically connected to the quartz blank disposed on the substrate, and a plurality of through-electrodes electrically connected to the plurality of electrode patterns disposed through the substrate, respectively.

In some embodiments, at least one of the plurality of through-electrodes is positioned on a side surface or an upper surface of the quartz blank.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1A:
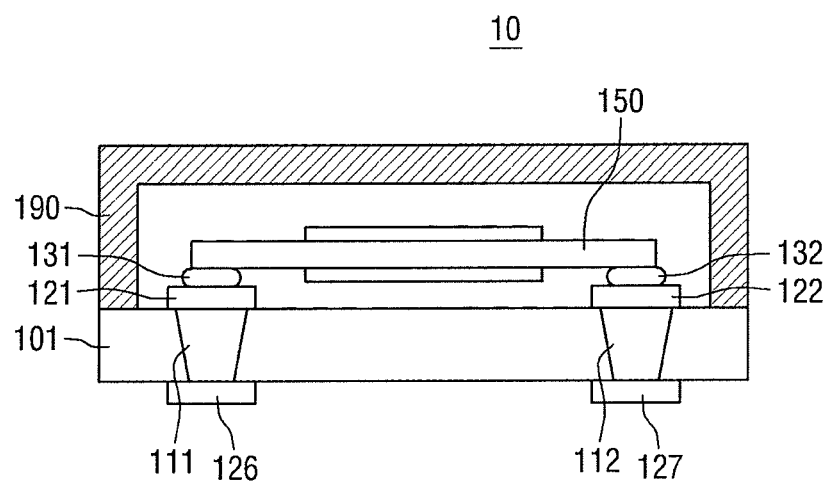
FIG. 1A is a cross-sectional view illustrating a sealed crystal oscillator according to a first embodiment of the present inventive concepts

Various example embodiments of the inventive concepts will be described more fully hereinafter with reference to the accompanying drawings, in which some example embodiments are shown. The present invention may, however, be embodied in many different forms and should not be construed as being limited to the embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another element, component, region, layer and/or section. Thus, for example, a first element, component, region, layer and/or section discussed below could be termed a second element, component, region, layer and/or section without departing from the teachings of the present inventive concepts.

Example embodiments are described with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concepts.

Figure 1B:
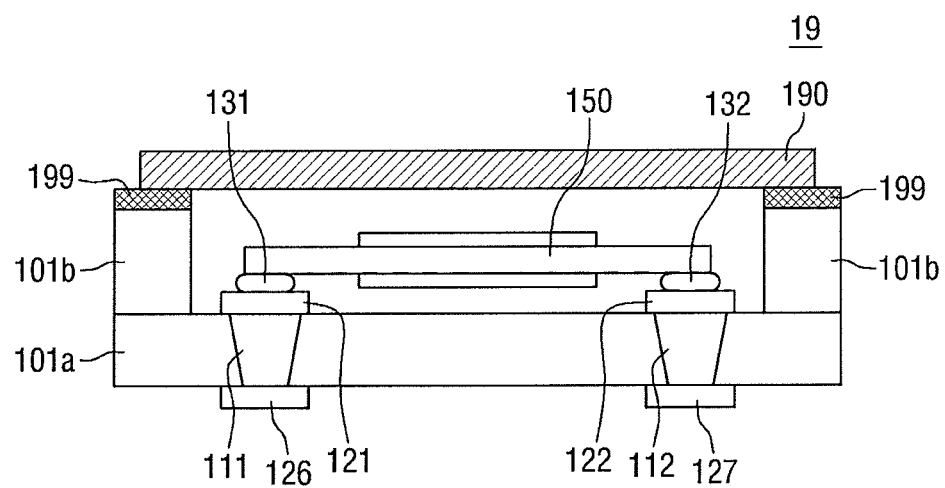
FIG. 1B is a cross-sectional view illustrating a sealed crystal oscillator according to a second embodiment of the present inventive concepts.
Figure 2:
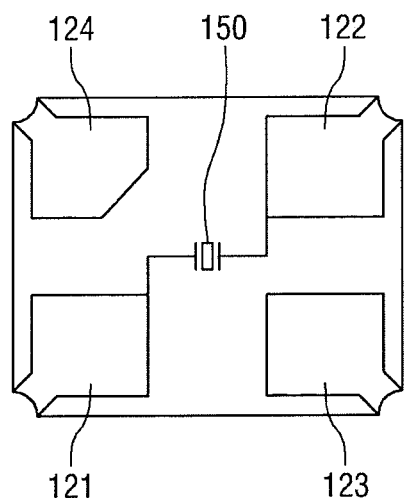
FIG. 2 is a plan view illustrating electrode patterns of the sealed crystal oscillators illustrated in FIGS. 1A and 1B.
Figure 3:
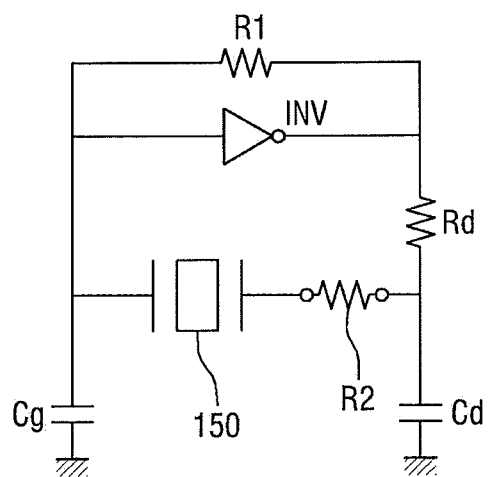
FIG. 3 is an example circuit diagram of the sealed crystal oscillators illustrated in FIGS. 1A and 1B.
Figure 4:
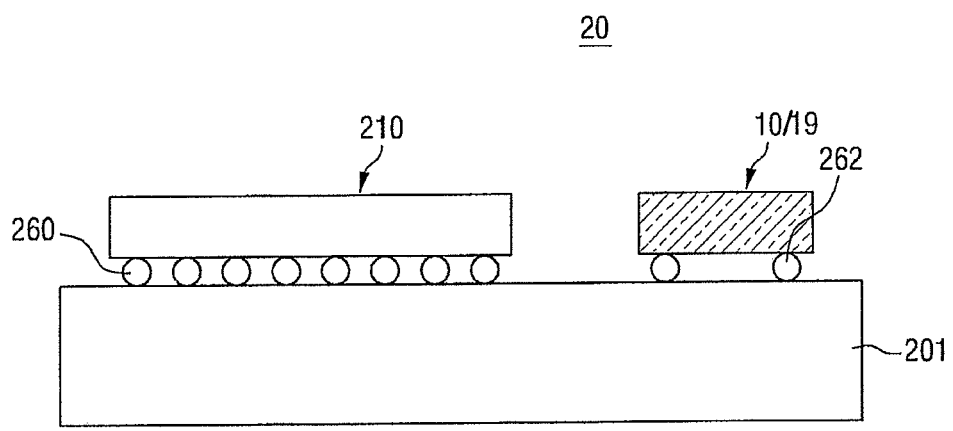
FIG. 4 is a cross-sectional view illustrating a semiconductor package according to a first embodiment of the present inventive concepts.

FIG. 1A is a cross-sectional view illustrating a sealed crystal oscillator according to a first embodiment of the present inventive concepts, and FIG. 1B is a cross-sectional view illustrating a sealed crystal oscillator according to a second embodiment of the present inventive concepts. FIG. 2 is a plan view illustrating electrode patterns of the sealed crystal oscillator illustrated in FIGS. 1A and 1B, and FIG. 3 is an example circuit diagram of the sealed crystal oscillator illustrated in FIGS. 1A and 1B. FIG. 4 is a cross-sectional view illustrating a semiconductor package according to a first embodiment of the present inventive concepts.

First, referring to FIG. 1A, a sealed crystal oscillator, or quartz oscillator, 10 according to a first embodiment of the present inventive concepts may include a substrate 101, a quartz blank 150, and a sealing cap 190.

In order to transfer a signal to an external device or to receive a signal from the external device, a plurality of electrode patterns 121 and 122 are formed on one surface (for example, an upper surface) of the substrate 101, and a plurality of wiring patterns 126 and 127 are formed on the other surface (for example, a lower surface) of the substrate 101. Further, a plurality of through-electrodes 111 and 112 penetrate the substrate 101 to electrically connect the plurality of electrode patterns 121 and 122 and the plurality of wiring patterns 126 and 127, respectively, with each other.

FIG. 1A illustrates that the plurality of electrode patterns 121 and 122, the plurality of through-electrodes 111 and 112, and the plurality of wiring patterns 126 and 127 are positioned below the quartz blank 150. However, the positions of the above-described elements are not limited thereto.

The plurality of electrode patterns 121 and 122 may be, for example, in a shape as illustrated in FIG. 2. That is, as illustrated in FIG. 2, four electrode patterns 121 to 124 are formed on four surfaces of the substrate 101. The quartz blank 150 may be electrically connected to the two electrode patterns 121 and 122 which are arranged diagonally from each other.

Referring again to FIG. 1A, the quartz blank 150 is formed on one surface of the substrate 101. The quartz blank 150 comprises quartz crystals (hexagonal), and may comprise a natural material or synthetic quartz having low impurity content and high crystallinity may be used. The quartz blank 150 may be electrically connected to the plurality of electrode patterns 121 and 122 through adhesives 131 and 132. The quartz blank 150 generates a resonance phenomenon in accordance with an externally applied signal.

The adhesives 131 and 132 may be conductive pastes, such as silver, tungsten, or palladium. In accordance with the thickness of the adhesives 131 and 132, a gap between the substrate 101 and the quartz blank 150 can be adjusted. The electrical connection between the quartz blank 150 and the plurality of electrode patterns 121 and 122 is not limited to the use of the adhesives, but may be made using connection terminals (for example, solder balls).

The sealing cap 190 is formed to cover at least one surface of the quartz blank 150. For example, the sealing cap 190 may cover an upper surface or a side surface of the quartz blank 150. As illustrated in FIG. 1A, the sealing cap 190 is formed to cover the upper surface and the side surfaces of the quartz blank 150.

The substrate 101 is in a "—" shape, that is, a line-shape, and the sealing cap 190 is formed on the substrate 101 in a "Π" shape to cover the quartz blank 150. The "Π" shape may mean a box shape of which one surface is opened, a box shape of which corner portions are rounded and of which one surface is opened, or a hemispheric shape.

The sealing cap 190 may include metal. For example, the metal may comprise aluminum, copper, tungsten, gold, or silver; however, the metal is not limited thereto.

Although not separately illustrated in the drawing, the sealing cap 190 and the substrate may be bonded together through melting of a metal material. For example, the metal material may comprise AuSn, but is not limited thereto.

The operation of the sealed quartz oscillator 10 will be described. If a constantly changing voltage is applied to the quartz blank 150 through the plurality of electrode patterns 121 and 122, the quartz blank 150 starts oscillation due to a reverse piezoelectric effect. If the driving frequency is equal to the natural frequency of the crystals, the quartz blank 150 resonantly oscillates as a resonator. The sealing cap 190 protects the quartz blank 150 from an influence exerted by changes of the temperature/humidity or fine foreign substances, and enables the sealed quartz oscillator 10 to operate stably.

A circuit diagram of the sealed quartz oscillator 10 may be as illustrated in FIG. 3, but is not limited thereto. For example, capacitors Cg and Cd may be connected to both ends of the quartz blank 150, and resistors R1 and Rd and an inverter INV may be connected between the both ends of the quartz blank 150. A resistor R2 may be connected between one end of the quartz blank 160 and the capacitor Cd.

Referring to FIG. 1B, in the sealed quartz oscillator 19 according to the second embodiment of the present inventive concepts, the substrate 101 may include a first substrate 101a and second substrates 101b formed on parts of the first substrate 101a, for example an upper surface of the first substrate 101a. A space may be formed in a region between the second substrates 101b that face each other, and the quartz blank 150 may be positioned in the space between the second substrates 101b. That is, the quartz blank 150 may be formed in the space formed by the first substrate 101a and the second substrates 101b.

The plurality of electrode patterns 121 and 122 may be positioned on the upper surface of the first substrate 101a, the plurality of wiring patterns 126 and 127 may be positioned on a lower surface of the first substrate 101a, and the plurality of through-electrodes 111 and 112 may be arranged to penetrate the first substrate 101a to electrically connect the plurality of electrode patterns 121 and 122 and the plurality of wiring patterns 126 and 127, respectively, with each other.

The sealing cap 190 may be arranged on an upper surface of the second substrates 101b. The sealing cap 190 covers one surface of the quartz blank 150, and includes metal. For example, the metal may comprise aluminum, copper, tungsten, gold, or silver; however, the metal is not limited thereto. The sealing cap 190 may be in a "—" shape, that is, a line-shape.

The second substrates 101b and the sealing cap 190 may be bonded together by a bonding portion 199. The bonding portion 199 is formed through melting of a metal material, and the metal material may be, for example, AuSn, but is not limited thereto. As described above, the second substrates 101b and the sealing cap 190 are bonded together by the bonding portion 199 that is formed through melting of the metal material.

In an alternative embodiment, the second substrates 101b and the sealing cap 190 may be bonded together, for example, by a seam sealing method (that is, a resistance welding method). If the seam sealing method is used, the height of the sealed quartz oscillator 19 is increased, and thus it may not be easy to mount the sealed quartz oscillator 19 in a semiconductor package. However, in the case where the thickness of a package substrate of the semiconductor package is sufficiently thick or the thickness of the semiconductor package itself is sufficiently thick, the seam sealing method may be used.

Referring to FIG. 4, a semiconductor package 20 according to the first embodiment of the present inventive concepts may include a package substrate 201, an integrated circuit chip 210, and a sealed quartz oscillator 10, as illustrated in FIG. 1A, or 19, as illustrated in FIG. 1B. As illustrated in FIG. 4, the sealed quartz oscillator 10 or 19 may be arranged on, or adjacent to, a side surface of the integrated circuit chip 210. That is, the integrated circuit chip 210 and the sealed quartz oscillator 10 or 19 may be formed on the same surface (for example, upper surface) of the package substrate 201.

The integrated circuit chip 210 may be a chip related to an AP (Application Processor), a CIS (CMOS Image Sensor), and a memory, but is not limited to a specific kind of chip.

The substrate 201 and the integrated circuit chip 210 may be connected to each other through, for example, a connection terminal 260. The sealed quartz oscillator 10 or 19 and the substrate 201 may be connected to each other through, for example, a connection terminal 262.

In the semiconductor package 20 according to the first embodiment of the present inventive concepts, the sealed quartz oscillator 10 or 19 is built in the semiconductor package 20. As compared with the quartz oscillator which is not built in the semiconductor package, but is formed on a PCB board, the sealed quartz oscillator 10 or 19 built in the semiconductor package 20 can reduce the size of the PCB board and the BOM (Bill Of Material) cost. In addition, the built-in quartz oscillator may be useful for manufacturing a mobile application which requires a small size and a thin thickness. Further, since the distance between the integrated circuit chip 210 and the sealed quartz oscillator 10 or 19 is short, the routing capacitance and inductance of a signal of the sealed quartz oscillator 10 or 19 is reduced.

In addition, since the sealed quartz oscillator 10 or 19 is sealed by the sealing cap 190, it is not affected by the changes of the temperature/humidity or the fine foreign substances. That is, the sealed quartz oscillator 10 or 19 operates stably.

Hereinafter, using FIGS. 5 through 10, semiconductor packages according to some example embodiments of the present inventive concepts will be described. Although FIGS. 5 through 10 illustrate that a sealed quartz oscillator 10, as illustrated in FIG. 1A, is built in the semiconductor package, it is apparent that a sealed quartz oscillator 19, as illustrated in FIG. 1B may be built in the semiconductor package, rather than the sealed quartz oscillator 10.

Figure 5:
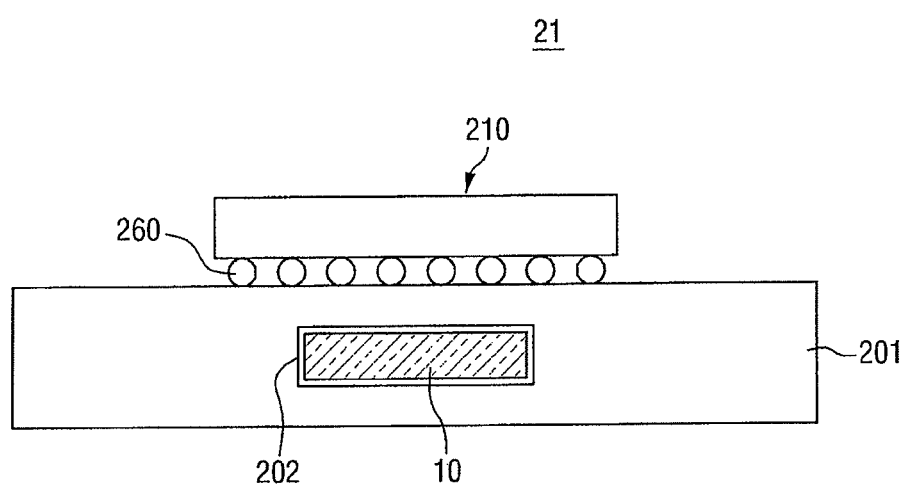
FIG. 5 is a cross-sectional view illustrating a semiconductor package according to a second embodiment of the present inventive concepts.

FIG. 5 is a cross-sectional view illustrating a semiconductor package according to a second embodiment of the present inventive concepts.

Referring to FIG. 5, in a semiconductor package 21 according to the second embodiment of the present invention, an integrated circuit chip 210 is formed on a substrate 201, and the substrate 201 and the integrated circuit chip 210 may be connected to each other through, for example, a connection terminal 260. A space 202 may be formed in the substrate 201, and a sealed quartz oscillator 10 may be positioned in the space 202.

Figure 6:
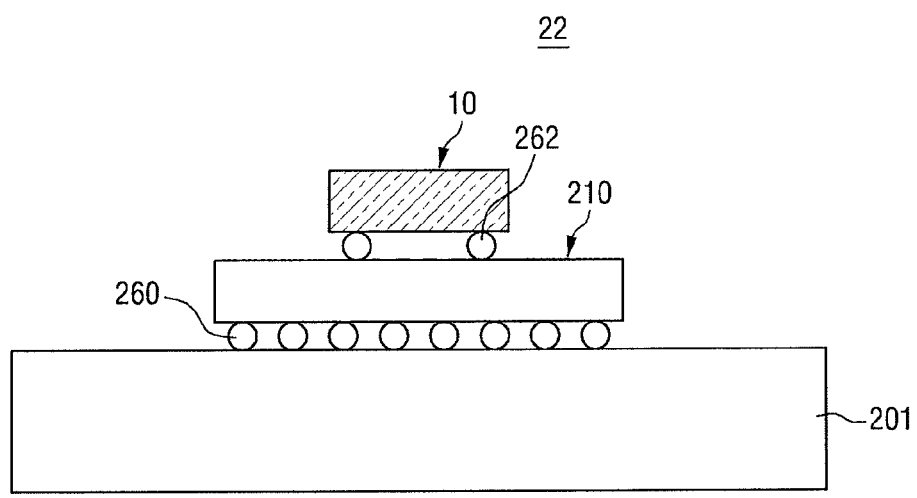
FIG. 6 is a cross-sectional view illustrating a semiconductor package according to a third embodiment of the present inventive concepts.

FIG. 6 is a cross-sectional view illustrating a semiconductor package according to a third embodiment of the present inventive concepts. For convenience of explanation, the detailed explanation will be made around a different point from that explained in connection with FIG. 5.

Referring to FIG. 6, in a semiconductor package 22 according to the third embodiment of the present inventive concepts, an integrated circuit chip 210 may be formed on a substrate 201, and a sealed quartz oscillator 10 may be positioned on the integrated circuit chip 210. The substrate 201 and the integrated circuit chip 210 may be connected to each other through, for example, a connection terminal 260. The sealed quartz oscillator 10 and the integrated circuit chip 210 may be connected to each other through, for example, a connection terminal 262. Although not illustrated in the drawing, in an alternative embodiment, the sealed quartz oscillator 10 may be formed on the substrate 201, and the integrated circuit chip 210 may be positioned on the sealed quartz oscillator 10.

Figure 7:
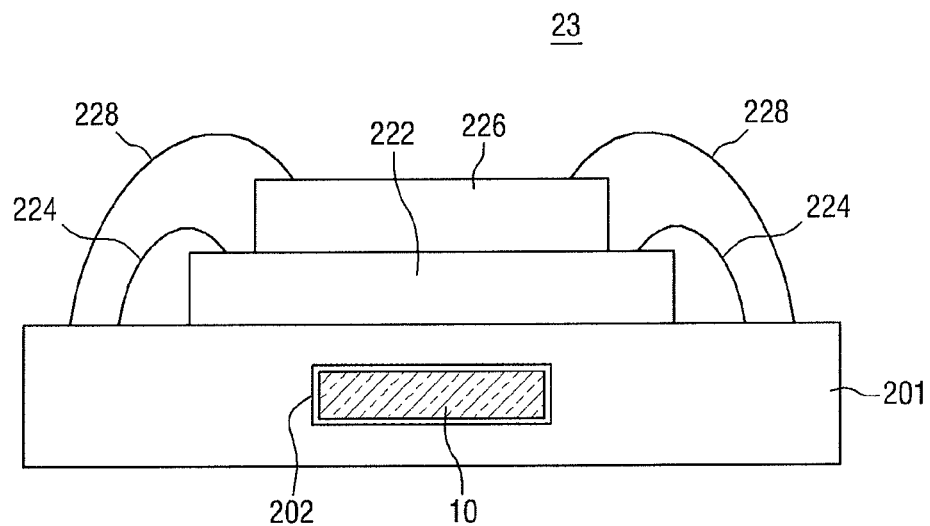
FIG. 7 is a cross-sectional view illustrating a semiconductor package according to a fourth embodiment of the present inventive concepts.

FIG. 7 is a cross-sectional view illustrating a semiconductor package according to a fourth embodiment of the present inventive concepts. For convenience of explanation, the detailed explanation will be made around different points from that explained in connection with FIG. 5.

Referring to FIG. 7, in a semiconductor package 23 according to the fourth embodiment of the present inventive concepts, a plurality of integrated circuit chips 222 and 226 may be vertically stacked on one surface of a package substrate 201. For example, the upper integrated circuit chip 226 is arranged on the lower integrated circuit chip 222. The lower integrated circuit chip 222 may be electrically connected to the package substrate 201 through wires 224, and the upper integrated circuit chip 226 may be electrically connected to the package substrate 201 through wires 228. Although not separately illustrated, another type of connection means (for example, solder balls or TSV (Through Silicon Via)), which is not the wires 224 or 228, may be used.

Figure 8:
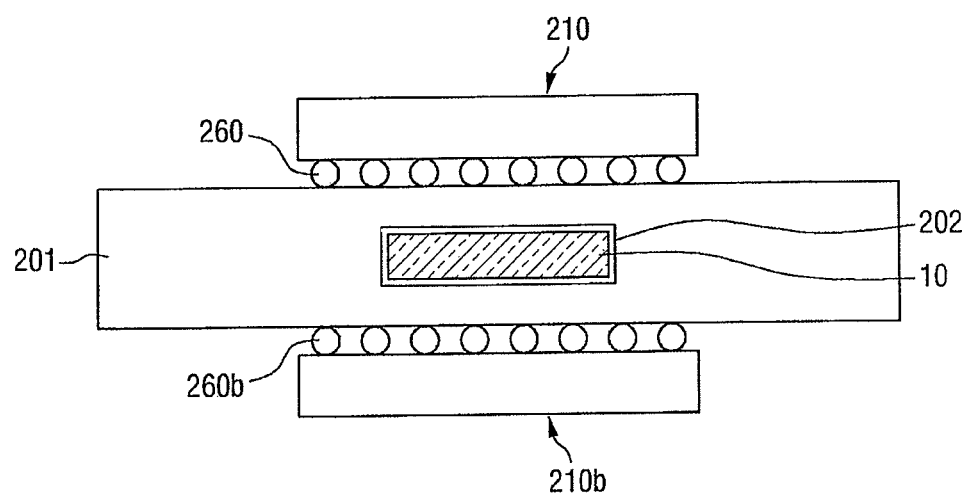
FIG. 8 is a cross-sectional view illustrating a semiconductor package according to a fifth embodiment of the present inventive concepts.

FIG. 8 is a cross-sectional view illustrating a semiconductor package according to a fifth embodiment of the present inventive concepts. For convenience of explanation, the detailed explanation will be made around different points from that explained in connection with FIG. 5.

Referring to FIG. 8, in a semiconductor package 24 according to the fifth embodiment of the present inventive concepts, a plurality of integrated circuit chips 210 may be stacked in mirror type. The integrated circuit chip 210 may be formed on one surface of a package substrate 201, and the integrated circuit chip 210 and the substrate 201 may be electrically connected to each other using a connection terminal (for example, solder balls) 260. An integrated circuit chip 210b may be formed on the other surface of the package substrate 201, and the integrated circuit chip 210b and the substrate 101 may be electrically connected to each other using a connection terminal (for example, solder balls) 260b.

As illustrated in FIGS. 7 and 8, a sealed quartz oscillator 10 may be built in the package substrate 201, for example in space 202 of the substrate 201. Further, as described above using FIG. 4 or 6, the sealed quartz oscillator 10 may be formed on the package substrate 201 or on the integrated circuit chip 222, 226, 210, or 210b.

Figure 9:
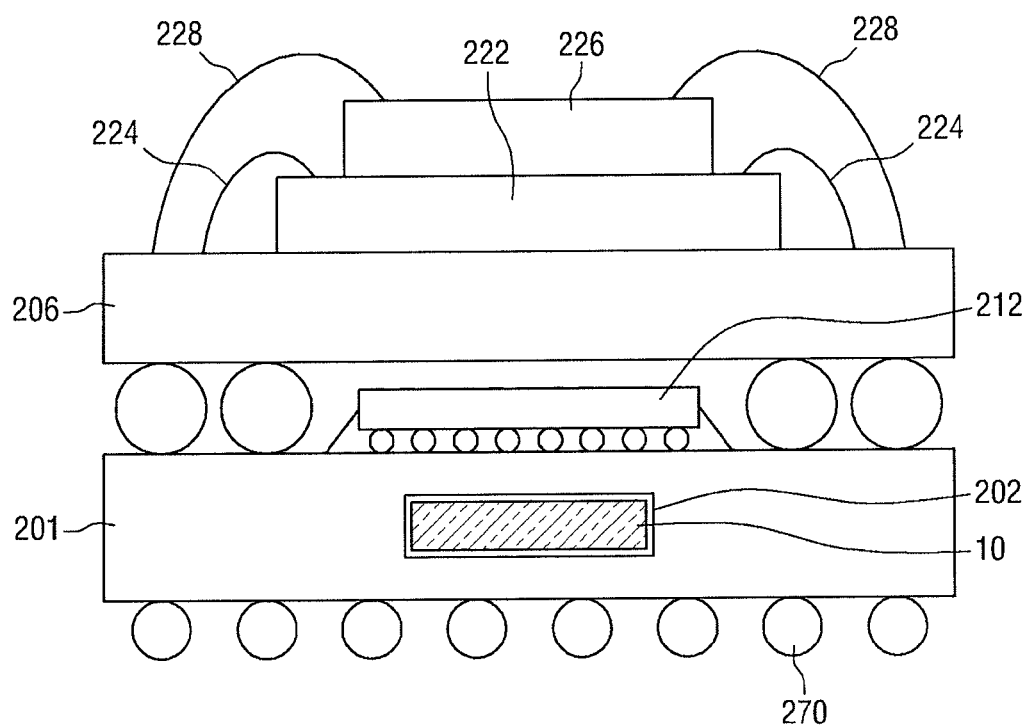
FIG. 9 is a cross-sectional view illustrating a semiconductor package according to a sixth embodiment of the present inventive concepts.

FIG. 9 is a cross-sectional view illustrating a semiconductor package according to a sixth embodiment of the present inventive concepts. For convenience of explanation, the detailed explanation will be made around different points from that explained in connection with FIG. 5.

Referring to FIG. 9, a semiconductor package 25 according to the sixth embodiment of the present invention may be in a POP (Package On Package) shape. A lower semiconductor package 252 and an upper semiconductor package 251 may be electrically connected to each other through a connection terminal (for example, solder balls) 266. The lower package 252 may include connection terminals (for example solder balls) 270 to connect to an external device. The lower semiconductor package 252 may include a package substrate 201 and an integrated circuit chip 212 formed thereon, and the upper semiconductor package 251 may include a package substrate 206 and integrated circuit chips 222 and 226 formed thereon. The illustrated semiconductor packages 251 and 252 are merely examples, and are not limited to those as illustrated. Further, in the drawing, it is illustrated that a sealed quartz oscillator 10 is positioned in a space 202 in the lower package substrate 201, but is not limited thereto. For example, the sealed quartz oscillator 10 may be positioned in the upper package substrate 206. Alternatively, as described above using FIG. 4 or 6, the sealed quartz oscillator 10 may be formed on the package substrate 201 or on the integrated circuit chip 222, 226 and 212.

Figure 10:
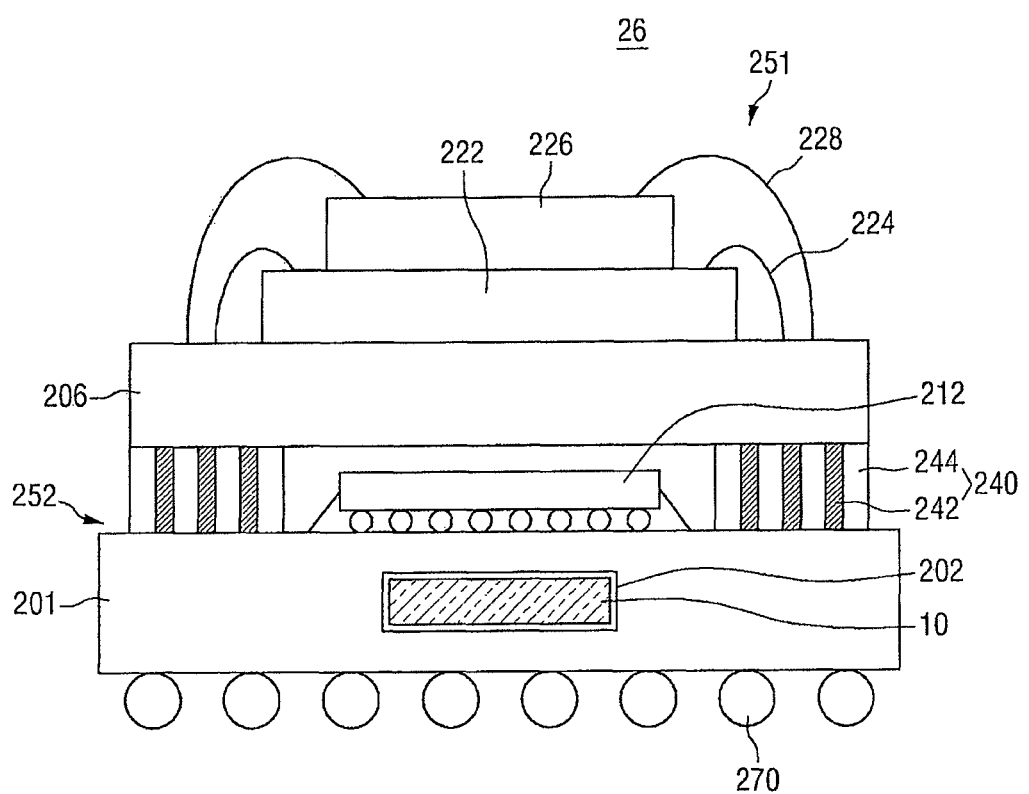
FIG. 10 is a cross-sectional view illustrating a semiconductor package according to a seventh embodiment of the present inventive concepts.

FIG. 10 is a cross-sectional view illustrating a semiconductor package according to a seventh embodiment of the present inventive concepts. For convenience of explanation, the detailed explanation will be made around different points from that explained in connection with FIG. 5.

Referring to FIG. 10, a semiconductor package 26 according to the seventh embodiment of the present inventive concepts may be in a POP (Package On Package) shape. A lower semiconductor package 252 and an upper semiconductor package 251 may be electrically connected to each other through a wiring structure 240, rather than connection terminals 266 as illustrated in FIG. 9. For example, the wiring structure 240 may include a vertical wiring 242 defined by an insulating region 244.

FIGS. 11 through 14 are cross-sectional views illustrating sealed crystal oscillators according to third through sixth embodiments of the present inventive concepts. For convenience of explanation, the detailed explanation will be made around different points from those explained in connection with FIGS. 1A to 3.

Sealed crystal oscillators, or sealed quartz oscillators 11 through 14 according to third through sixth embodiments of the present inventive concepts may be built in semiconductor packages 20 to 26 illustrated in FIGS. 4 to 10.

Figure 11:
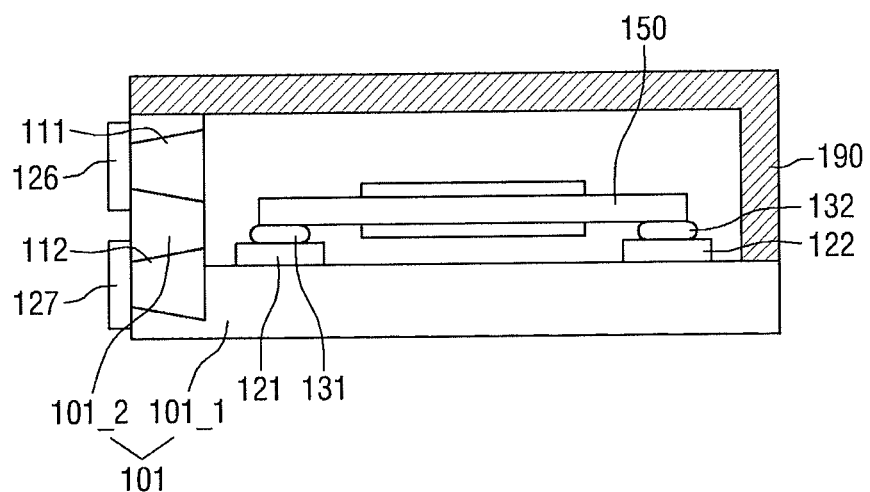
FIGS. 11 through 14 are cross-sectional views illustrating sealed crystal oscillators according to third through sixth embodiments of the present inventive concepts.

First, referring to FIG. 11, in the sealed quartz oscillator 11 according to the third embodiment of the present inventive concepts, a substrate 101 is in a "L" shape, that is, a L-shape, and a sealing cap 190 is formed on the substrate 101 in a "⌐" shape, that is, a L-shape that is opposite to the L-shape of the substrate 101, to cover a quartz blank 150. That is, the substrate 101 may include a first portion 101_1 and a second portion 101_2 which is connected to the first portion 101_1 and is formed in a side wall shape that is, for example, perpendicular to the first portion 101_1. A plurality of through-electrodes 111 and 112 may be positioned on or adjacent to a side surface of the quartz blank 150. That is, the plurality of through-electrodes 111 and 112 may be positioned on the second portion 101_2 that is in the side wall shape. A plurality of electrode patterns 121 and 122 are formed on an upper surface of the first portion 101_1. The quartz blank 150 may be electrically connected to the plurality of electrode patterns 121 and 122 through adhesives 131 and 132, respectively.

Figure 12:
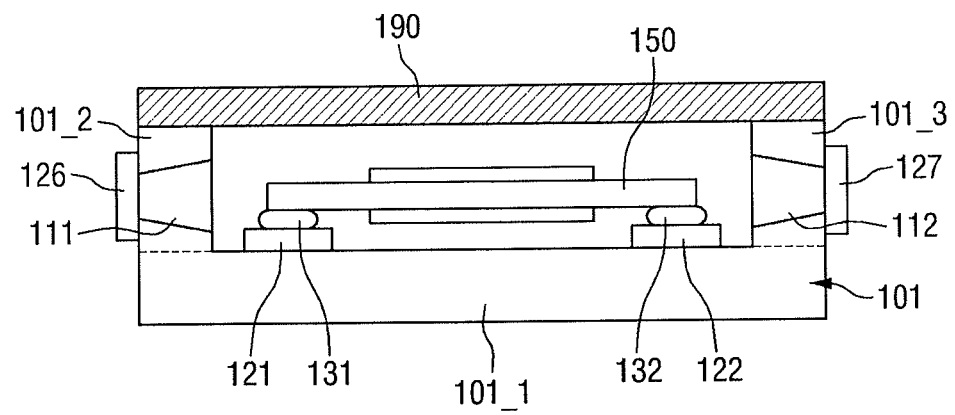

Referring to FIG. 12, in the sealed quartz oscillator 12 according to the fourth embodiment of the present inventive concepts, a substrate 101 is in a "U" shape and a sealing cap 190 is formed on the substrate 101 in a "—" shape, that is, a line-shape, to cover a quartz blank 150. That is, the substrate 101 may include a first portion 101_1, and a second portion 101_2 and a third portion 101_3, which are connected to the first portion 101_1 and are formed in a side wall shape, that is, for example perpendicular to the first portion 101_1. The second portion 101_2 and the third portion 103_3 are spaced apart from each other and the quartz blank 150 is positioned in the space between the second portion 101_2 and the third portion 101_3 on the first portion 101_1. A plurality of through-electrodes 111 and 112 may be positioned on or adjacent to a side surface of the quartz blank 150. For example, one through-electrode 111 of the plurality of through-electrodes 111 and 112 may be positioned on the second portion 101_2 that is in the side wall shape, and the other through-electrode 112 of the plurality of through-electrodes 111 and 112 may be positioned on the third portion 101_3 that is in the side wall shape. A plurality of electrode patterns 121 and 122 are formed on an upper surface of the first portion 101_1. The quartz blank 150 may be electrically connected to the plurality of electrode patterns 121 and 122 through adhesives 131 and 132, respectively.

Figure 13:
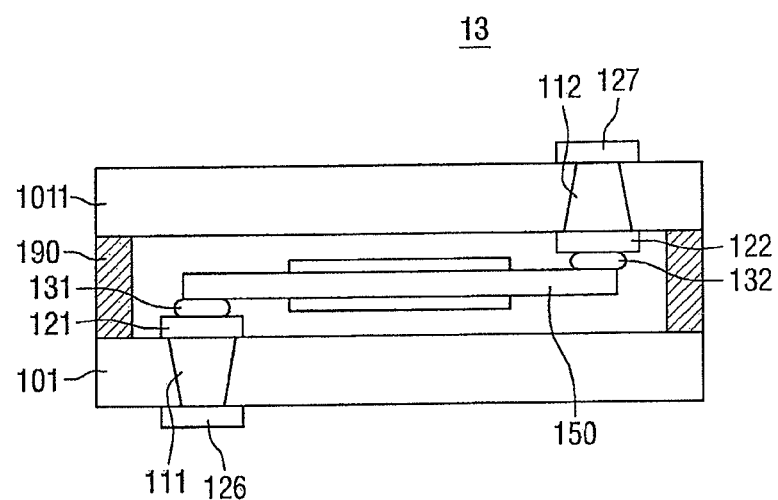

Referring to FIG. 13, in the sealed quartz oscillator 13 according to the fifth embodiment of the present inventive concepts, a sealing cap 190 may be positioned on or adjacent to a side surface of a quartz blank 150. Specifically, a lower substrate 101 may be positioned on one surface (that is, a lower surface) of the quartz blank 150, and an upper substrate 1011 may be positioned on the other surface (that is, an upper surface) of the quartz blank 150. One through-electrode 111 of the plurality of through-electrodes 111 and 112 may be positioned on the lower substrate 101, and the other through-electrode 112 of the plurality of through-electrodes 111 and 112 may be positioned on the upper substrate 1011. The quartz blank 150 is positioned in a space between the sealing cap 190, the lower substrate 101 and the upper substrate 1011. The electrode pattern 121 is formed or disposed on an upper surface of lower substrate 101. The electrode pattern 122 is formed or disposed on a lower surface of upper substrate 1011. The quartz blank 150 may be electrically connected to the plurality of electrode patterns 121 and 122 through adhesives 131 and 132, respectively.

Figure 14:
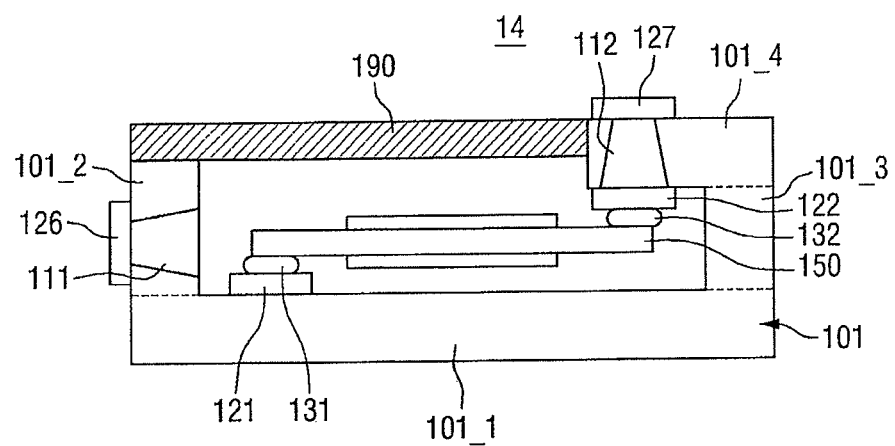

Referring to FIG. 14, in the sealed quartz oscillator 14 according to the sixth embodiment of the present inventive concepts, a sealing cap 190 may be formed to cover only a part of one surface of a quartz blank 150. A substrate 101 may be positioned on the remaining region where the sealing cap 190 is not formed. For example, the substrate 101 may include a first portion 101_1, a second portion 101_2 and a third portion 101_3, which are connected to the first portion 101_1 and are formed in a side wall shape, that is, for example, perpendicular to the first portion 101_1, and a fourth portion 101_4 formed in parallel to the first portion 101_1. The fourth portion 101_4 may be formed to overlap one portion of the quartz blank 150. For example, one through-electrode 112 of the plurality of through-electrodes 111 and 112 may be positioned on or adjacent to one surface (for example, an upper surface) of the quartz blank 150, and the other through-electrode 111 of the plurality of through-electrodes 111 and 112 may be positioned on or adjacent to the side surface of the quartz blank 150. For example, one through-electrode 111 of the plurality of through-electrodes 111 and 112 may be positioned on the second portion 101_2, and the other through-electrode 112 of the plurality of through-electrodes 111 and 112 may be positioned on the fourth portion 101_4. The quartz blank 150 is positioned in a space between the sealing cap 190 and the substrate 101 including first portion 101_1, the second portion 101_2, the third portion 101_3 and the fourth portion 101_4. The electrode pattern 121 is formed or disposed on an upper surface of first portion 101_1. The electrode pattern 122 is formed or disposed on a lower surface of fourth portion 101_4. The quartz blank 150 may be electrically connected to the plurality of electrode patterns 121 and 122 through adhesives 131 and 132, respectively.

As described above using FIGS. 11 through 14, at least one of the plurality of through-electrodes 111 and 112 is positioned on or adjacent to the side surface or the upper surface of the quartz blank 150. The reason why the plurality of through-electrodes 111 and 112 are not positioned only on the lower portion of the quartz blank 150, but are arranged in various positions is to easily build the plurality of through-electrodes in the semiconductor package. That is, the positions of the plurality of through-electrodes 111 and 112 may be changed to match the shapes of several neighboring integrated circuits and package substrates. If the plurality of through-electrodes 111 and 112 are positioned only on the lower portion of the quartz blank 150, the position in which the quartz blank 150 is built may be limited (that is, it may be built in a specific position only).

Although not separately indicated in FIGS. 11 through 14, the sealing cap 190 and the substrate 101 may be bonded together through melting of a metal material. For example, the metal material may be AuSn, but is not limited thereto.

Figure 15:
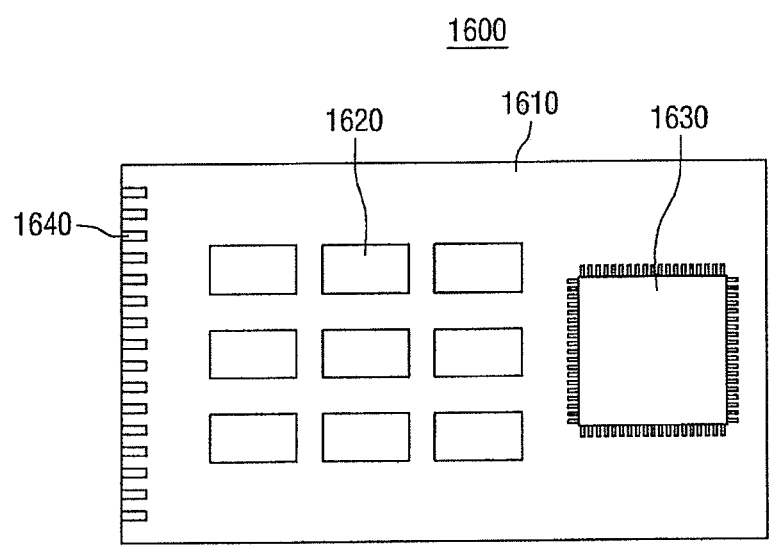
FIG. 15 is a plan view illustrating a package module type semiconductor system according to an example embodiment of the present inventive concepts.
Figure 16:
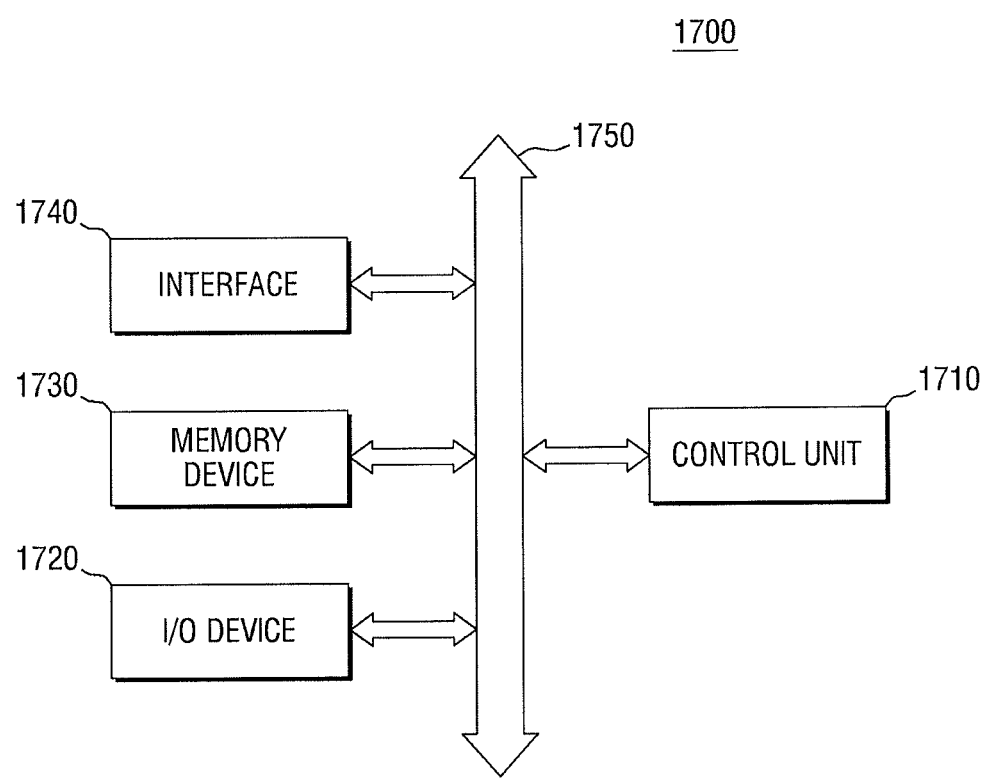
FIG. 16 is a block diagram illustrating a semiconductor system including a semiconductor package according to an example embodiment of the present inventive concepts.
Figure 17:
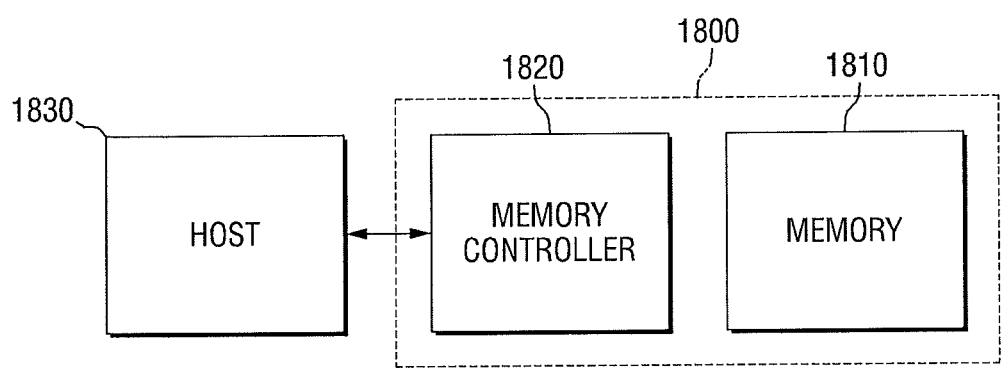
FIG. 17 is a block diagram illustrating a semiconductor system including a semiconductor package according to an example embodiment of the present inventive concepts.

FIGS. 15 through 17 are diagrams illustrating semiconductor systems according to some example embodiments of the present inventive concepts.

FIG. 15 is a plan view illustrating a package module type semiconductor system according to an example embodiment of the present inventive concepts.

Referring to FIG. 15, the above-described semiconductor packages 20 to 26 can be applied to a package module type semiconductor system 1600 including various kinds of semiconductor elements. The semiconductor system 1600 may include a circuit board 1610 including terminals 1640, a semiconductor chip 1620 mounted on the circuit board 1610, and a QFP (Quad Flat Package)-packaged semiconductor chip 1630. The semiconductor chips 1620 and 1630 may adopt the packaging technique according to embodiments of the present inventive concepts. That is, the semiconductor chips 1620 and 1630 may include semiconductor packages 20 to 26 as described above. The semiconductor system 1600 may be connected to an external electronic device through the terminals 1640.

Referring to FIG. 16, the above-described semiconductor packages 20 to 26 may be applied to a semiconductor system 1700 such as an electronic system. The semiconductor system 1700 may include a controller 1710, an input/output (I/O) device 1720, a memory 1730 and an interface 1740. The controller 1710, the I/O device 1720, the memory 1730, and the interface 1740 may be coupled to one another through a bus 1750 which provides paths through which data is transferred.

For example, the controller 1710 may include at least one of a microprocessor, a digital signal processor, a microcontroller, and logic elements that can perform similar functions. The controller 1710 and the memory 1730 may include at least one of the above-described semiconductor packages 20 to 26. The I/O device 1720 may include at least one selected from a keypad, a keyboard, and a display device. The memory 1730 may store data and/or commands that are executed by the controller 1710.

The memory 1730 may include a volatile memory, such as a DRAM, and/or a nonvolatile memory, such as a flash memory. For example, the flash memory may be mounted on an information processing system, such as a mobile device or a desk top computer. The flash memory may include a SSD (Solid State Drive). In this case, the electronic system 1700 can stably store large capacity data in the flash memory system.

The semiconductor system 1700 may further include an interface 1740 which may function to transfer data to a communication network or receive the data from the communication network. The interface 1740 may be of a wired or wireless type. For example, the interface 1740 may include an antenna or a wire/wireless transceiver. The semiconductor system 1700 may further include an application chipset, a camera image processor (CIS), and an I/O device.

The semiconductor system 1700 may be implemented by a mobile system, a personal computer, an industrial computer, or a logic system that performs various functions. For example, the mobile system may be any one of a PDA (Personal Digital Assistant), a portable computer, a web tablet, a mobile phone, a wireless phone, a laptop computer, a memory card, a digital music system, and an information transmission/reception system. In the case where an electronic system 1300 is equipment that can perform wireless communication, the electronic system 1300 may be used in a communication system, such as CDMA (Code Division Multiple Access), GSM (Global System for Mobile communication), NADC (North American Digital Cellular), E-TDMA (Enhanced-Time Division Multiple Access), WCDMA (Wideband Code Division Multiple Access), or CDMA2000.

Referring to FIG. 17, the above-described semiconductor packages 20 to 26 may be provided in the form of a semiconductor system 1800, such as a memory card. As an example, the semiconductor system 1800 may include a memory 1810, such as a nonvolatile memory device, and a memory controller 1820. The memory 1810 and the memory controller 1820 can store data or read the stored data. The memory 1810 may include at least one of nonvolatile memory devices to which the semiconductor package technique according to the present inventive concepts is applied. That is, the memory 1810 may include at least one of the above-described semiconductor packages 20 to 26. The memory controller 1820 may control the memory 1810 to read the stored data or to store the data in response to a read/write request of a host 1830.

While the inventive concepts have been particularly shown and described with reference to example embodiments thereof, it will be understood that various changes in form and details may be made therein without departing from the spirit and scope of the following claims.

What is claimed is:

1. A semiconductor package comprising:
a package substrate;
an integrated circuit chip disposed on one surface of the package substrate; and
a sealed quartz oscillator disposed on at least one of an interior portion and a first exterior surface of the package substrate,
wherein the sealed quartz oscillator includes a substrate, a quartz blank disposed on one surface of the substrate, and a sealing cap covering at least one surface of the quartz blank, wherein the sealing cap comprises metal,
wherein the sealed quartz oscillator further comprises a plurality of electrode patterns electrically connected to the quartz blank disposed on the substrate, and a plurality of through-electrodes electrically connected to the plurality of electrode patterns disposed through the substrate, respectively, and
wherein at least one of the plurality of through-electrodes is positioned on a side surface or an upper surface of the quartz blank.

2. The semiconductor package of claim 1, wherein the sealing cap covers an upper surface or a side surface of the quartz blank.

3. The semiconductor package of claim 2, wherein the substrate is in a line-shape, and the sealing cap is formed on the substrate in a box-shape to cover the quartz blank.

4. The semiconductor package of claim 2, wherein the substrate is in a L-shape, and the sealing cap is formed on the substrate in an L-shape opposite to the L-shape of the substrate to cover the quartz blank.

5. The semiconductor package of claim 2, wherein the substrate is in a U-shape, and the sealing cap is formed on the substrate in a line-shape to cover the quartz blank.

6. The semiconductor package of claim 1, wherein the sealed quartz oscillator is formed on a side surface, an upper surface, or a lower surface of the integrated circuit chip.

7. The semiconductor package of claim 1, wherein the substrate and the sealing cap are bonded together by a bonding portion that is formed through melting of a metal material.

8. The semiconductor package of claim 7, wherein the metal material is AuSn.

9. The semiconductor package of claim 1, wherein the semiconductor package is in a POP (Package On Package) shape.

10. The semiconductor package of claim 1, wherein the integrated circuit chip comprises a plurality of stacked integrated circuit chips.

* * * * *